United States Patent
Kawaguchi et al.

(10) Patent No.: US 9,655,295 B2
(45) Date of Patent: May 16, 2017

(54) ATTACHMENT FOR FEEDER INSTALLATION AND METHOD FOR FEEDER INSTALLATION

(71) Applicant: PANASONIC INTELLECTUAL PROPERTY MANAGEMENT CO., LTD., Osaka (JP)

(72) Inventors: Satoshi Kawaguchi, Yamanashi (JP); Shigekazu Yoneyama, Yamanashi (JP); Tatsuo Yamamura, Fukuoka (JP); Kazunori Kanai, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 394 days.

(21) Appl. No.: 14/403,347

(22) PCT Filed: Mar. 4, 2013

(86) PCT No.: PCT/JP2013/001324
§ 371 (c)(1),
(2) Date: Nov. 24, 2014

(87) PCT Pub. No.: WO2013/179532
PCT Pub. Date: Dec. 5, 2013

(65) Prior Publication Data
US 2015/0181776 A1    Jun. 25, 2015

(30) Foreign Application Priority Data
May 29, 2012    (JP) .................................. 2012-121545

(51) Int. Cl.
*H05K 13/02* (2006.01)
*H05K 13/04* (2006.01)

(52) U.S. Cl.
CPC ......... *H05K 13/02* (2013.01); *H05K 13/0417* (2013.01); *Y10T 29/49826* (2015.01)

(58) Field of Classification Search
CPC .......................................... H05K 13/00–13/04
See application file for complete search history.

(56) References Cited

U.S. PATENT DOCUMENTS 4,819,699 A * 4/1989 Brown .................... H05K 13/02
140/105
5,515,600 A * 5/1996 Iwasaki .............. H05K 13/0417
206/713

(Continued)

FOREIGN PATENT DOCUMENTS

CN    101035425 A    9/2007
JP    2003-298287 A    10/2003

(Continued)

OTHER PUBLICATIONS

International Search Report for Application No. PCT/JP2013/001324 dated Apr. 23, 2013.

(Continued)

*Primary Examiner* — Christopher M Koehler
(74) *Attorney, Agent, or Firm* — Pearne & Gordon, LLP

(57) ABSTRACT

A feeder installing attachment includes: a main body portion including attachment side fitting parts provided on a lower surface thereof and having an installing compatibility with first feeder side fitting parts provided on a lower surface of a first tape feeder; and second feeder installing slots formed on an upper surface of the main body portion and engaging with second feeder side fitting parts provided on a lower surface of a second tape feeder having a standard width smaller than that of the first tape feeder. In a state where the attachment is mounted, an array pitch of the second feeder installing slots is smaller than an array pitch of the base side (Continued)

SECTIONAL VIEW TAKEN ALONG LINE F-F installing slots, and becomes an array pitch corresponding to the standard width of the second tape feeder.

4 Claims, 8 Drawing Sheets

(56) References Cited

U.S. PATENT DOCUMENTS

| | | | | |
|---|---|---|---|---|
| 2010/0118508 A1* | 5/2010 | Okada | ................ | G01N 21/8806 |
| | | | | 362/3 |
| 2010/0229380 A1* | 9/2010 | Endo | .................. | H05K 13/0452 |
| | | | | 29/760 |
| 2011/0192021 A1* | 8/2011 | Tanaka | ............... | H05K 13/0452 |
| | | | | 29/739 |
| 2012/0317802 A1* | 12/2012 | Yamamoto | ........... | H05K 13/021 |
| | | | | 29/832 |

FOREIGN PATENT DOCUMENTS

| | | |
|---|---|---|
| JP | 2008-078172 A | 4/2008 |
| JP | 2011-249379 A | 12/2011 |

OTHER PUBLICATIONS

Chinese Office Action for Application No. 201380028240.6 dated Jun. 1, 2016.
Chinese Search Report for Application No. 201380028240.6 dated Jun. 1, 2016.

* cited by examiner

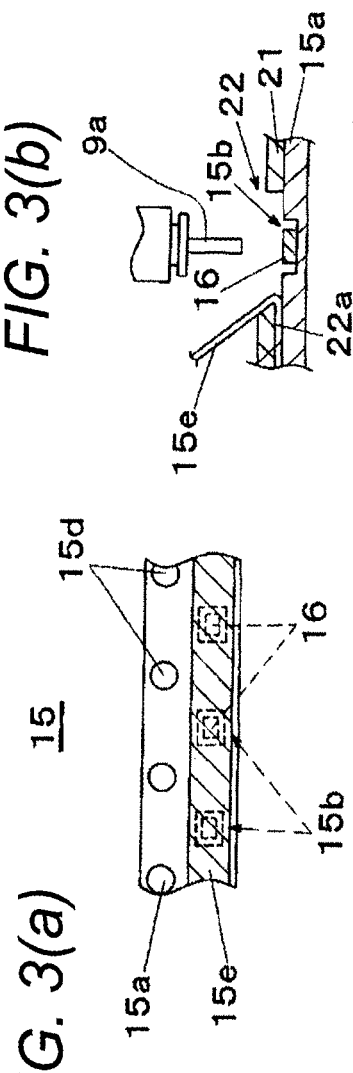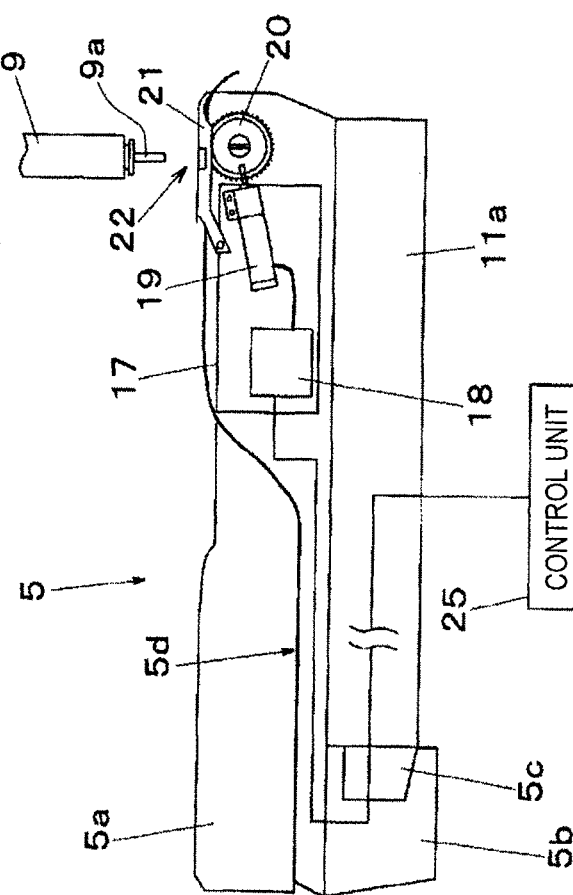

SECTIONAL VIEW TAKEN ALONG LINE A-A

SECTIONAL VIEW TAKEN ALONG LINE A-A

FIG. 6(a)
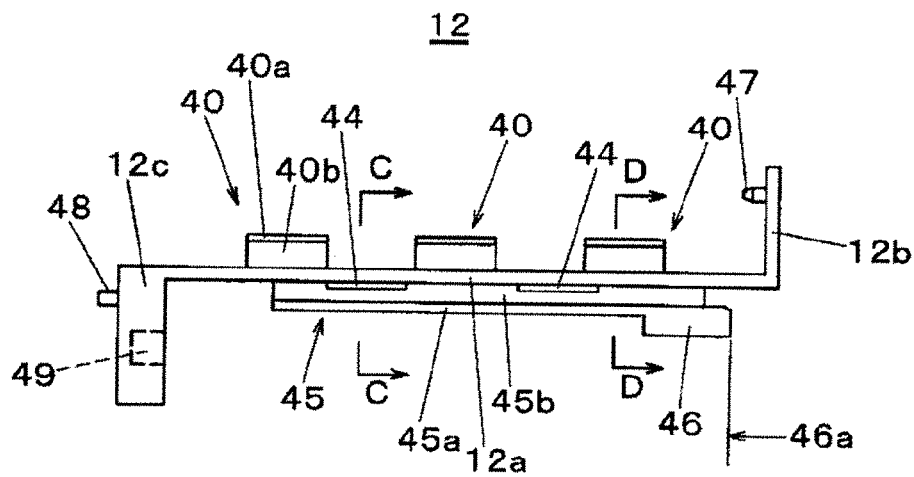
FIG. 6(b)
FIG. 6(c)
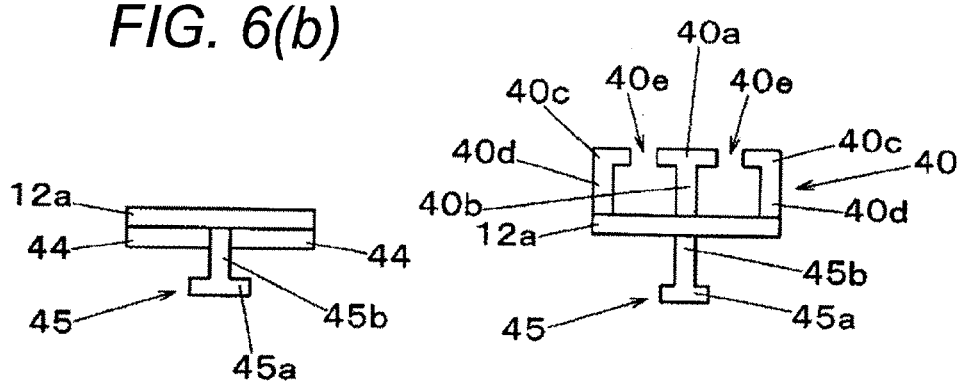
SECTIONAL VIEW TAKEN ALONG LINE C-C      SECTIONAL VIEW TAKEN ALONG LINE D-D

SECTIONAL VIEW TAKEN ALONG LINE E-E

SECTIONAL VIEW TAKEN ALONG LINE F-F

ATTACHMENT FOR FEEDER INSTALLATION AND METHOD FOR FEEDER INSTALLATION

TECHNICAL FIELD

The present invention relates to a feeder installation attachment used for install a plurality of types of tape feeder with different standard widths on a common feeder base, and a feeder installation method using the attachment.

BACKGROUND ART

A tape feeder is often used as a method of supplying electronic components in an electronic component mounting apparatus. A component supply unit provided in an electronic component mounting apparatus is provided with a feeder base, on which a plurality of tape feeders are removably installed, in a form fixedly installed on a base table of a mounting apparatus or disposed on a dedicated cart. A common method of installing a tape feeder on a feeder base is to fit an inverted-T shape fitting part protruded on a lower surface of a tape feeder into a plurality of T-shaped slots juxtaposed in a feeder installing direction on an upper surface of a feeder base (refer to Patent Document 1, for example). In the related art shown in the Patent Document, an installing guide having a T-shaped slot is provided on an upper surface of a feeder base, and a longitudinal member having a T-shaped cross section is disposed on a lower surface of a tape feeder, and a tape feeder is positioned in a longitudinal direction and vertical direction, by fitting a longitudinal member into a T-shaped slot.

RELATED ART DOCUMENTS

Patent Documents

Patent Document 1: JP-A-2003-298287

SUMMARY OF THE INVENTION

Problem to be Solved by the Invention

Related art including an example of the above document has following difficulties in improving versatility to support a variety of products, and area productivity to increase facility efficiency. Namely, it is desirable for improving the versatility to install as many tape feeders as possible on one electronic component mounting apparatus in order to supply as many types of electronic components as possible, and it is desirable for improving the area productivity to reduce a width dimension of a tape feeder as small as possible in order to decrease an area occupied by a component supply unit. However, in the related art, for arranging a tape feeder of a different width dimension in a component supply unit, it is necessary to replace a feeder base itself with one having a T-shaped slot of an array pitch corresponding to a width dimension of a tape feeder. Thus, for improving the versatility and area productivity in an existing electronic component mounting apparatus, it is necessary to prepare an additional facilities, on top of the existing ones, such as a feeder base or a cart to match a new tape feeder. This makes it difficult to strike a balance between effective use and compatibility of existing facilities.

Accordingly, an object of the invention is to provide a feeder installation attachment and a feeder installation method, which can strike a balance between effective use and compatibility of existing facilities in order to improve versatility and area productivity of an electronic component mounting apparatus.

Means for Solving the Problem

The present invention provides a feeder installation attachment used for installing a plurality of types of tape feeder with different standard widths on a common feeder base in an electronic component mounting apparatus, the feeder base having a plurality of rows of base side installing slots which engage with first feeder side fitting parts provided on a lower surface of a first tape feeder installed directly on the feeder base, out of the plurality of types of tape feeder, the feeder installing attachment including: a main body portion including attachment side fitting parts provided on a lower surface of the main body portion, the attachment side fitting parts having an installing compatibility with the first feeder side fitting parts; and second feeder installing slots which are formed on an upper surface of the main body portion and which engage with second feeder side fitting parts provided on a lower surface of a second tape feeder having a standard width smaller than that of the first tape feeder, out of the plurality of types of tape feeder, wherein in a state in which the attachment is mounted on the feeder base by fitting the attachment side fitting parts into the base side installing slots, an array pitch of the second feeder installing slots is smaller than an array pitch of the base side installing slots, and becomes an array pitch corresponding to the standard width of the second tape feeder.

The present invention provides a feeder installation method for installing a plurality of types of tape feeder with different standard widths on a common feeder base in an electronic component mounting apparatus, the feeder base having a plurality of rows of base side installing slots which engage with first feeder side fitting parts provided on a lower surface of a first tape feeder installed directly on the feeder base, out of the plurality of types of tape feeder, the feeder installing method including: a first feeder installing step of directly installing a first tape feeder on the feeder base by fitting the first feeder side fitting parts into base side installing slots; an attachment mounting step of mounting an attachment on the feeder base, the attachment including: a main body portion including attachment side fitting parts provided on a lower surface of the main body portion, the attachment side fitting parts having an installing compatibility with the first feeder side fitting parts; and second feeder installing slots which are formed on an upper surface of the main body portion and which engage with second feeder side fitting parts provided on a lower surface of a second tape feeder having a standard width smaller than that of the first tape feeder, out of the plurality of types of tape feeder, thereby making an array pitch of the second feeder installing slots correspond to the standard width of the second tape feeder; and a second feeder installing step of installing the second tape feeder on the feeder base via the attachment by fitting the second feeder side fitting parts provided on the lower side of the second tape feeder into the second feeder installing slots in a state that the attachment is mounted on the feeder base.

Advantages of the Invention

According to the invention, an attachment provided with an attachment side fitting part having an installation compatibility with a first feeder side fitting part provided on a lower surface of a first tape feeder to be directly installed on a feeder base, out of the plurality of types of tape feeder with different standard widths, is mounted on a feeder base in order to install a second tape feeder having a standard width smaller than that of a first tape feeder, and a second feeder installing slot to be engaged with a second feeder side fitting part provided on a lower surface of a second tape feeder is provided on an upper surface of a main body portion. In a state that an attachment is mounted on a feeder base by fitting an attachment side fitting part into a base side installing slot, an array pitch of a second feeder installing slot is smaller than an array pitch of a base side installing slot, and becomes an array pitch corresponding to a standard width of a second tape feeder. This make it possible to install the plurality of types of tape feeder with different standard widths on a common feeder base, and to achieve both effective use and compatibility of existing facilities for the purpose of improving versatility and area productivity of an electronic component installation apparatus.

BRIEF DESCRIPTION OF THE DRAWINGS

FIGS. 3(a), 3(b) and 3(c) are side views of a tape feeder according to an embodiment of the invention.

FIGS. 6(a), 6(b) and 6(c) are drawings explaining a feeder installation attachment in an electronic component mounting apparatus according to an embodiment of the invention.

MODE FOR CARRYING OUT THE INVENTION

Figure 1:
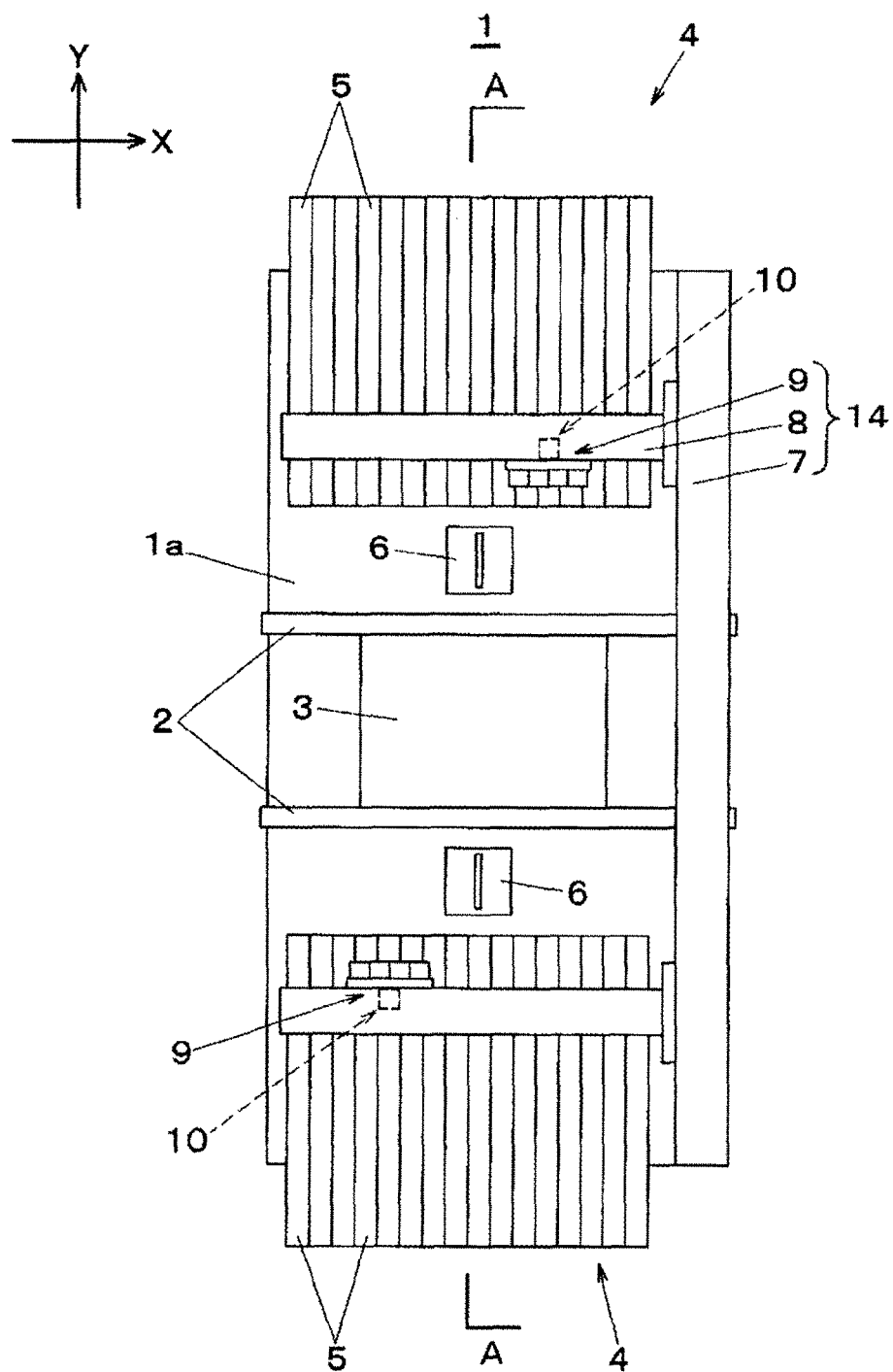
FIG. 1 is a plan view of an electronic component mounting apparatus according to an embodiment of the invention.
Figure 2:
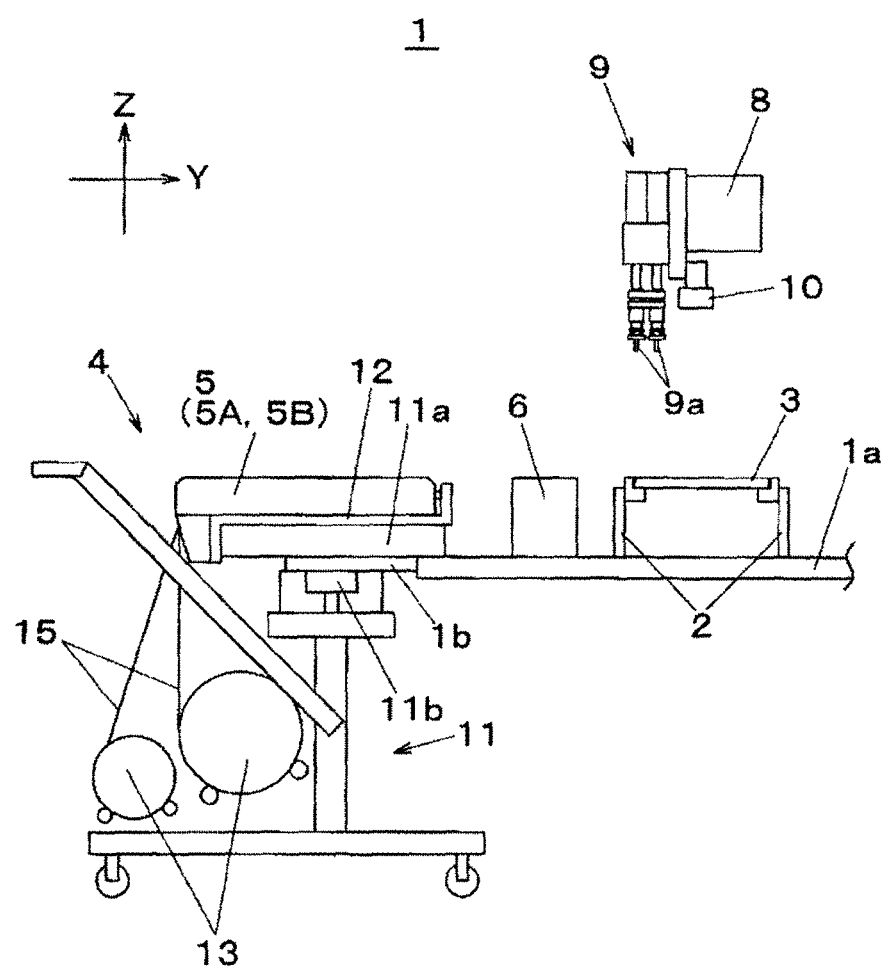
FIG. 2 is a partially sectional view of an electronic component mounting apparatus according to an embodiment of the invention.

Next, an embodiment of the invention will be explained with reference to the accompanying drawings. First, a structure of an electronic component mounting apparatus 1 will be explained with reference to FIG. 1 and FIG. 2. FIG. 2 partially shows a sectional view taken along lines A-A of FIG. 1. In FIG. 1, in the middle of a base table 1a, a substrate transportation mechanism 2 is disposed in an X-direction (a substrate transportation direction). The substrate transportation mechanism 2 transports a substrate 3 supplied from an upstream apparatus and mounted by the apparatus, and positions it at a component mounting position. On both sides of the substrate transportation mechanism 2, a component supply unit 4 is disposed. Each component supply unit 4 includes a plurality of tape feeders 5 juxtaposed to each other. The tape feeder 5 has a function of feeding a carrier tape, holding an electronic component at certain pitches, and thereby supplying an electronic component to a component vacuum position where a vacuum nozzle 9a of a mounting head 9 picks up a component as described below.

At the distal end of one side in the X direction on the upper surface of the base table 1a, a Y-axis moving table having a linear drive mechanism is disposed. Further, two X-axis moving tables 8 having a similar linear drive mechanism are connected to the Y-axis moving table 7 movably in the Y-direction. Each of the two X-axis moving tables 8 is provided with a mounting head 9 movable in the X-direction. The mounting head 9 is a multiple head having a plurality of holding heads. In the lower end portion of each holding head, as shown in FIG. 2, vacuum nozzles 9a are provided individually movable up and down by picking up an electronic component.

By driving the Y-axis moving table 7 and X-axis moving table 8, the mounting head 9 moves in the X direction and Y direction. Thus, two mounting heads 9 take out an electronic component 16 (refer to FIGS. 3(a) and (b)) from a corresponding tape feeder 5 of the component supply unit 4 by a vacuum nozzle 9a, and transport and mount the component on the substrate 3 positioned by the substrate transportation mechanism 2. The Y-axis moving table 7, X-axis moving table 8, and mounting head 9 constitute a component mounting mechanism 14 by moving the mounting head 9 holding the electronic component 16.

A component recognition camera 6 is disposed between the component supply unit 4 and the corresponding substrate transportation mechanism 2. When the mounting head 9 moves above the component recognition camera 6 after taking out the electronic component 16 from the component supply unit 4, the component recognition camera 6 recognizes the electronic component 16 by capturing its image. The mounting head 9 is provided with a substrate recognition camera 10, which is located under the X-axis moving table, and is configured to move together with the mounting head 9. When the mounting head 9 moves, the substrate recognition camera 10 moves above the substrate 3 positioned by the substrate transportation mechanism 2, and recognizes the substrate 3 by capturing its image. In the operation of mounting a component on the substrate 3 by the mounting head 9, a mounting position is corrected by regarding the recognition result of the electronic component 16 by the component recognition camera 6 as well as the recognition result of the substrate by the substrate recognition camera 10.

As shown in FIG. 2, in the component supply unit 4, a cart 11 is set in a state that a plurality of tape feeders 5 has been set on a feeder base 11a. In the embodiment, a plurality of of tape feeder 5 with different standard widths, that is, a first tape feeder 5A with a standard width B1 (refer to FIG. 5(b)) and a second tape feeder 5B with a standard width B2, ½ of the standard width B1, are installed on a common feeder base 11a. When the second tape feeder 5B is installed on the feeder base 11a, an attachment 12 is inserted between them.

In the state that the tape feeder 5 is installed on the feeder base 11a, by clamping the feeder base 11a to a fixing base 1b provided on the base table 1a by a clamp mechanism 11b, the position of the cart 11 is fixed in the component supply unit 4. The cart 11 has a supply reel 13 containing a carrier tape 15 holding an electronic component in a wound state. The carrier tape 15 fed out of the supply reel 13 is fed at certain pitches to a pickup position of the vacuum nozzle 9a.

Next, the configuration and the function of the tape feeder 5 will be explained with reference to FIGS. 3(a), 3(b) and 3(c). As shown in FIG. 3(c), the tape feeder includes a main body portion 5a, and an installing part 5b protruded downward from the lower surface of the main body portion 5a. In a state that the tape feeder 5 is installed with the lower surface of the main body portion 5a aligned along the feeder base 11a, a connector 5a provided in the installing part 5b is connected to the feeder base 11a. Thus, the tape feeder 5 is rigidly fixed to the component supply unit 4, and the tape feeder 5 is electrically connected to a control unit 25 of the electronic component mounting apparatus 1.

Inside the main body portion 5a, a tape running path 5d, which leads the carrier tape 15 unreeled from the supply reel 13 and taken into the main body portion 5a, is provided continuously from the rear end to the front end of the main body portion 5a. The electronic component mounting apparatus 1 of the embodiment employs a splicing method, which splices a rear end of a first carrier tape 15A already mounted in the tape feeder 5 with a front end of a second carrier tape 15B to be mounted on the occasion of running out of components, by a joint J using a splicing tape. Thus, the carrier tape 15 can be continuously supplied to the tape feeder 5 without causing interruption.

As shown in FIG. 3(b), the carrier tape 15 is configured to have a component pocket 15b having a recess for housing and holding an electronic component 16, and a feed hole 15d for pitch feeding the carrier tape 15, each of them being formed at predetermined pitches on a base tape 15a which constitutes a tape body. As also shown in FIG. 3(a), the upper surface of the base tape 15a is sealed with a top tape 15e covering the component pocket 15b, to prevent the electronic component 16 from falling off the component pocket 15b.

The main body portion 5a incorporates a tape feed unit 17 for pitch feeding the carrier tape 15. The tape feed unit 17 includes a tape feed motor 19 configured to rotationally drive a sprocket 20 provided at the front end of the tape running path 5d, and a feeder control unit 18 configured to control the tape feed motor 19. In a state that the tape feeder 5 is installed on the feeder base 11a, the feeder control unit 18 is connected to the control unit 25.

The sprocket 20 is provided with a feed pin (not shown) at regular pitches to fit into a feed hole 15d. In a state that the feed pin engages with the feed hole 15d, when the sprocket 20 is intermittently rotated by driving the tape feed motor 19, the carrier tape 15 is pitch-fed to the downstream side. The front side of the sprocket 20 serves as a pickup position where the vacuum nozzle 9a of the mounting head 9 picks up the electronic component 16 by vacuuming it from the component pocket 15b.

As shown in FIGS. 3(b) and 3(c), on the upper surface of the main body portion 5a near the sprocket 20, a pressing member 21 configured to guide the carrier tape 15 by pressing its upper surface is disposed. The pressing member 21 is provided with a vacuum opening 22 corresponding to a pickup position of the vacuum nozzle 9a. The upstream end of the vacuum opening 22 forms a top tape peeling part to peel off a top tape 15e. In other words, in the course where the carrier tape 15 runs under the pressing member 21, the top tape 15e is turned around the top tape peeling part 22a and fed to the upstream side, thereby the top tape 15e is peeled off from the base tape 15a in the upstream side of the pickup position, folded to the upstream side, and sent to a tape collection part provided inside the main body portion 5a, and taken up therein. Thus, the electronic component 16 inside the component pocket 15b is exposed upward in the vacuum opening 22, and can be picked up by the mounting head 9.

Figure 4A:
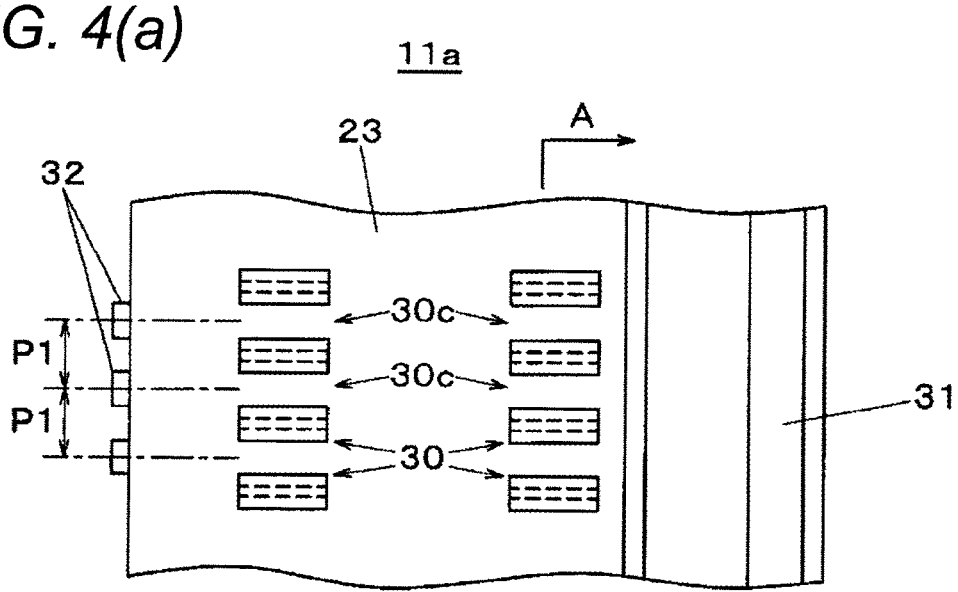
FIGS. 4(a), 4(b) and 4(c) are drawings explaining structures of a feeder base in an electronic component mounting apparatus according to an embodiment of the invention.
Figure 4B:
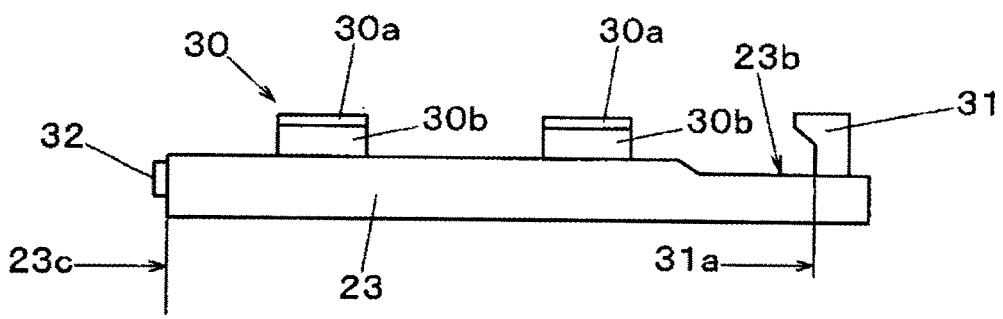
Figure 4C:
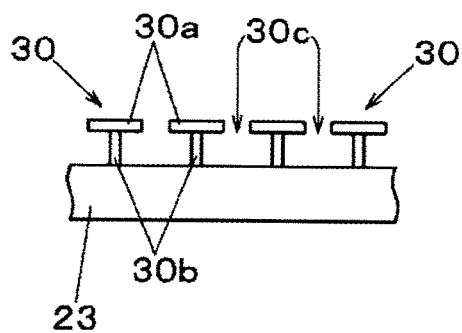

Next, the structure of the feeder base 11a will be explained with reference to FIGS. 4(a), 4(b) and 4(c). As shown in FIG. 4(a), the feeder base 11a mainly includes a flat base plate 23, and is provided with an installing guide member 30 having a T-shaped cross section on the upper surface 23a at a plurality of locations in the longitudinal direction with an array pitch P1 equal to an installation pitch of the first tape feeder 5A. As shown in FIGS. 4(b) and 4(c), the installing guide member 30 includes a web 30b provided upright on the upper surface 23a of the base plate 23, and a flat flange 30a. Further, as shown in a sectional view taken along lines A-A, a T-shaped base side installing slot 30c is formed for installing the tape feeder 5 and attachment 12 between adjacent installing guide members 30.

The tape feeder 5 and attachment 12 are installed slidably in a longitudinal direction (here, a tape feeding direction (a rightward direction in FIG. 2) is assumed to be the front) in a state that the lower surface of the main body portion is aligned with the upper surface 23a of the feeder base 11a. On the lower surface of the first tape feeder 5A and attachment 12, longitudinal members 35 and 45 having T-shaped cross sections with a flange faced downward (refer to FIGS. 5(a) to 5(d) and FIGS. 6(a) to 6(c)) are disposed in the longitudinal direction, and by fitting the longitudinal members 35 and 45 into the base side installing slot 30c, the sliding motion of the first tape feeder 5A and attachment 12 in the longitudinal direction can be guided. In other words, the feeder base 11a is provided with a plurality of rows of base side installing slots 30c, which engage with the longitudinal member 35 (the first feeder side fitting part) provided on the lower surface of the first tape feeder 5A, out of a plurality of types of tape feeder 5A, to be directly installed on the feeder base 11a.

In the front end portion of the base plate 23, a stopper member 31 for regulating the back-and-forth positions of the first tape feeder 5A and attachment 12, and a concaved portion 23b formed by shaving the upper surface 23a are provided. When the first tape feeder 5A and attachment 12 are installed, blocks 36 and 46 (refer to FIGS. 5(a) and 5(c) and FIG. 6(a)) are located in the recessed portion 23b and brought into contact with the stopper member 31. In the rear end surface 23c of the base plate 23, a base side connector 32 constituting the connector 5a shown in FIG. 2 is provided at a position corresponding to each base side installing slot 30c.

Figure 5A:
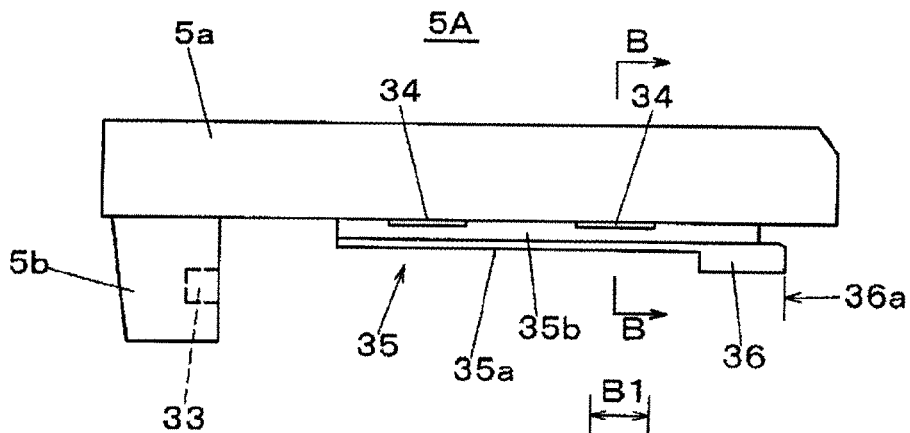
FIGS. 5(a), 5(b), 5(c) and 5(d) are drawings explaining installation states of a first tape feeder in an electronic component mounting apparatus according to an embodiment of the invention.

Next, the first tape feeder 5A and the installing state of the first tape feeder 5A on the feeder base 11a will be explained with reference to FIGS. 5(a) to 5(d). As shown in FIG. 5(a), on the lower surface of the main body portion 5a of the first tape feeder 5A, the longitudinal member 35 including the flange 35a and web 35b is provided in the longitudinal direction. In the front end portion of the longitudinal member 35, the block 36 with a partially increased thickness is provided. The shape of the front end portion of the block 36 corresponds to the stopper member 31 provided on the feeder base 11a. On the lower surface of the main body portion 5a, a liner member 34 is replaceably attached. As shown in a sectional view taken along lines B-B of FIG. 5(b), the first tape feeder 5A has a standard width B1. The standard width B1 corresponds to the array pitch P1 shown in FIG. 4(a). Thus, as shown in FIG. 5(c), the first tape feeder 5A can be directly installed on the feeder base 11a.

In a state that a longitudinal position of the main body portion 5a is determined by abutting the contact portion 36a of the block 36 to the positioning surface 31a of the stopper member 31, a vertical position of the main body portion 5a can be determined by abutting the linear member 34 onto the flange 30a. And, in this state, by fitting the base side connector 32, being provided on the rear end surface 23c, to the feeder side connector 33 provided in the installing part 5*b*, the control unit 25 (refer to FIG. 3(*c*)) and the feeder control unit 18 of the tape feed unit 17 are electrically connected via a first transmission circuit E1 and a second transmission circuit E2.

Next, the configuration of the attachment 12 for installing a feeder set on the feeder base 11*a* when installing the second tape feeder 5B (refer to FIGS. 8(*a*) to 8(*d*)) on the feeder base 11*a* will be explained with reference to FIGS. 6(*a*), 6(*b*) and 6(*c*). As a standard width of the second tape feeder 5B is half of the standard width B1 of the first tape feeder 5A, an attachment 12 for matching an array pitch is required for installing the second tape feeder 5B on the feeder base 11*a*, on which the installing guide member 30 is disposed at an array pitch P1.

As shown in FIGS. 7(*a*) and 7(*b*), the attachment 12 mainly include a plate-shaped main body portion 12*a* elongated back and forth. In the front end portion of the main body portion 12*a*, a front end member 12*b* bent and extended upward is provided. In the rear end portion, a rear end member 12*c* bend and extended downward is provided. On the rear surface of the front end member 12*b*, a position setting pin 47 for positioning the second tape feeder 5B is protruded. In the rear end member 12*c*, two second attachment side connectors 48, which fit to the feeder side connector 33 (refer to FIG. 8(*b*)) provided in the installing part 5*b* of the second tape feeder 5B, are provided corresponding to two second tape feeders 5B. These two attachment side connectors 48 are connected to two circuits formed by branching a wiring circuit from the first attachment side connector 49 in the attachment 12.

The attachment 12 is mounted on the upper surface 23*a* of the feeder base 11*a* slidably in the longitudinal direction. On the lower surface of the main body portion 12*a* of the attachment 12, a longitudinal member 45 (an attachment side fitting part) is disposed in the longitudinal direction. The longitudinal member 45 has an installing compatibility with the longitudinal member 35 which is a first feeder side fitting part provided on the lower surface of the first tape feeder 5A. By fitting the longitudinal member 45 into the base side installing slot 30*c*, the sliding motion of the attachment 12 in the longitudinal direction can be guided.

In the front end portion of the longitudinal member 45, a block 46 similar to the block 36 in the first tape feeder 5A is provided. By abutting the contact portion 46*a* of the block 46 to the positioning surface 31*a* of the stopper member 31, the longitudinal position of the main body portion 5*a* is determined. And, in this state, a liner member 44 provided on the lower surface of the main body portion 12*a* contacts a flange 40*a*, and the vertical position of the main body portion 5*a* is determined. And, in this state, the base side connector 32 provided in the rear end surface 23*c* of the feeder base 11*a* fits to the first attachment side connector 49 provided in the rear end member 12*c*, and the control unit 25 (refer to FIG. 3(*c*)) so that the feeder control unit 18 of the tape feed unit 17 are electrically connected via the base side connector 32 and feeder side connector 33.

In other words, in the above configuration, the feeder base 11*a* and tape feeder 5 are provided with the base side connector 32 and feeder side connector 33 for connecting/disconnecting a transmission circuit that transmits at least an electric control signal. As shown in FIG. 8(*b*), the base side connector 32 is connected to the control unit 25 via a first transmission circuit E1, and the feeder side connector 33 is connected to the feeder control unit 18 via a second transmission circuit E2. The first transmission circuit E1 and second transmission circuit E2 are connected via a branch circuit provided in the attachment 12. Thus, the number of connectable tape feeders 5 can be greatly increased without changing the configuration of the electrical system of the existing feeder base 11*a*.

On the upper surface of the main body portion 12*a*, a twin slot installing guide member 40 having a shape combining two T-shaped slots is formed at a plurality of locations in the longitudinal direction. As to the structure of the twin slot installing guide member 40, as shown in a sectional view taken along lines E-E of FIG. 7(*c*), a flange 40*a* and a web 40*b* are vertically provided on the center line of the main body portion 12*a* by combining with a T-shaped cross section, and a flange 40*c* and a web 40*d* are vertically provided at both ends by combining with an L-shaped cross section, thereby two rows of T-shaped slots are formed in parallel as a second feeder installing slot 40*e* for installing the second tape feeder 5B. In the twin slot installing guide member 40, an array pitch of the second feed installing slot 40*e* is an array pitch P2 (=P1/2) that is equal to the installing pitch of the second tape feeder 5B.

In other words, on the upper surface of the main body portion 12*a*, there is provided a second feeder installing slot 40*e*, which engages with the longitudinal member 45 (the second feeder side fitting part) provided on the lower surface of the second tape feeder 5B having a standard width smaller than that of the first tape feeder 5A, out of the plurality of types of tape feeder 5. In the embodiment shown here, two rows of second feeder installing slots 40*e* are formed in the attachment 12 set in one base side installing slot 30*c* as described above.

Next, the configuration of the second tape feeder 5B and the installing state of the second tape feeder 5B on the feeder base 11*a* will be explained with reference to FIGS. 8(*a*) to 8(*d*). As shown in FIG. 8(*a*), on the lower surface of the main body portion 5*a* of the second tape feeder 5B, a longitudinal member 55 combining with a flange 55*a* and a web 55*b* is provided in the longitudinal direction. As shown in FIG. 8(*b*), in the front end portion of the longitudinal member 55, a contact portion 56 having the same function as that of the block 36 in the first tape feeder 5A is provided. By abutting the front end portion of the contact portion 56 to the front end member 12*b*, the second tape feeder 5B is positioned in the longitudinal direction. And, in this state, the second attachment side connector 48 provided in the rear end member 12*c* fits to the feeder side connector 33 provided in the installing part 5*b*, and the control unit 25 (refer to FIG. 3(*c*)) is electrically connected to the feeder control unit 18 of the tape feed unit 17 of each second tape feeders 5B.

As shown in FIG. 8(*d*), on the lower surface of the main body portion 5*a*, a liner member 54 is replaceably attached. In a state that the longitudinal position of the main body portion 5*a* is determined, the vertical position of the main body portion 5*a* is determined by abutting the liner member 54 onto the flanges 40*a* and 40*c*. Further, in this state, as shown in FIGS. 8(*b*) and 8(*c*), the position setting pin 47 that is a position setting part provided in the front end member 12*b* of the elongate main body portion 12*a* fits into and locks a lock hole 5*e* that is a locked part provided on the front end surface of the second tape feeder 5B, thereby regulating the longitudinal position of the second tape feeder 5B and the vertical in-plane position perpendicular to the longitudinal direction.

As shown in FIG. 8(*c*), in a state that the attachment 12 is mounted on the feeder base 11*a* by fitting the longitudinal member 55, being an attachment side fitting part, into the base side installing slot 30*c*, the array pitch of the second feeder installing slot 40*e* is smaller than the array pitch of the base side installing slot 30*c*, and becomes an array pitch corresponding to the standard width of the second tape feeder 5B. In other words, in the example shown in the embodiment, the array pitch P2 of the second feeder installing slot 40e is ½ of the array pitch P1 of the base side installing slot 30c, and becomes an array pitch corresponding to the standard width of the second tape feeder 5B set to ½ of the standard width of the first tape feeder 5A.

Next, an explanation will be given to a feeder installation method of installing a plurality of tape feeders 5 with different standard widths (2 types, here) on the common feeder base 11a in the electronic component mounting apparatus 1. As described before (refer to FIG. 4(a)), in the embodiment, the feeder base 11a is provided with a plurality of rows of base side installing slots 30c which engage with the longitudinal member 35 provided on the lower surface of the first tape feeder 5A to be directly installed on the feeder base 11a, out of two types of tape feeders 5.

Figure 5B:
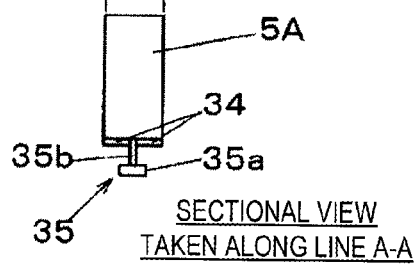
Figure 5C:
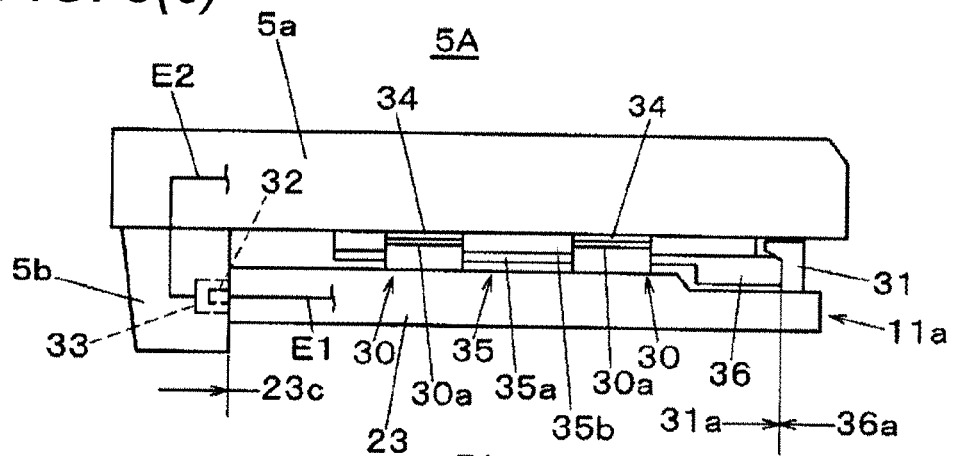
Figure 5D:
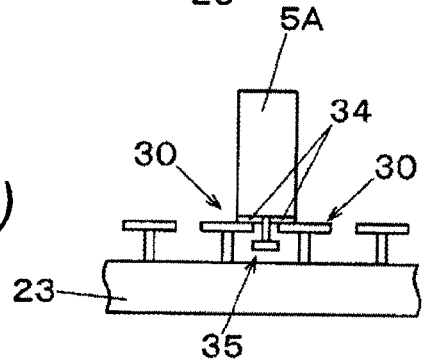

First, when supplying a component using the first tape feeder 5A, as shown in FIGS. 5(a) to 5(c), directly install the first tape feeder 5A on the feeder base 11a by fitting the longitudinal member 35 that is a first feeder side fitting part into the base side installing slot 30c (a first feeder installing step).

Figure 7A:
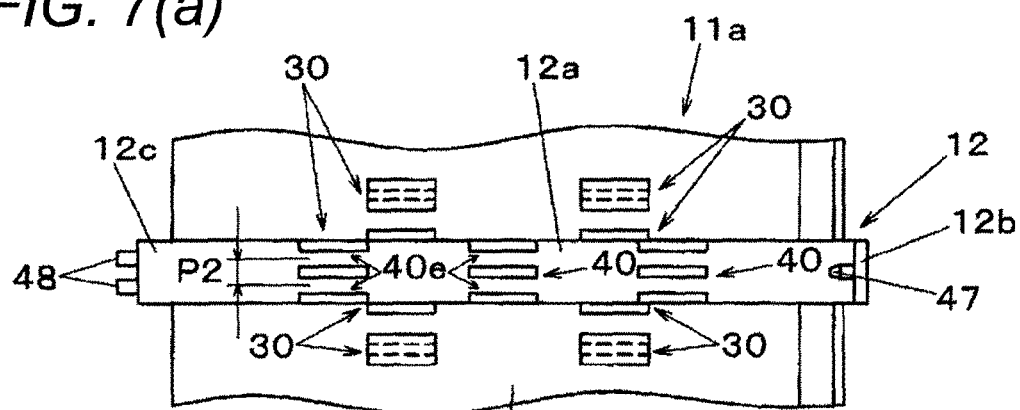
FIGS. 7(a), 7(b) and 7(c) are drawings explaining installation states of a feeder installation attachment on a feeder base in an electronic component mounting apparatus according to an embodiment of the invention.
Figure 7B:
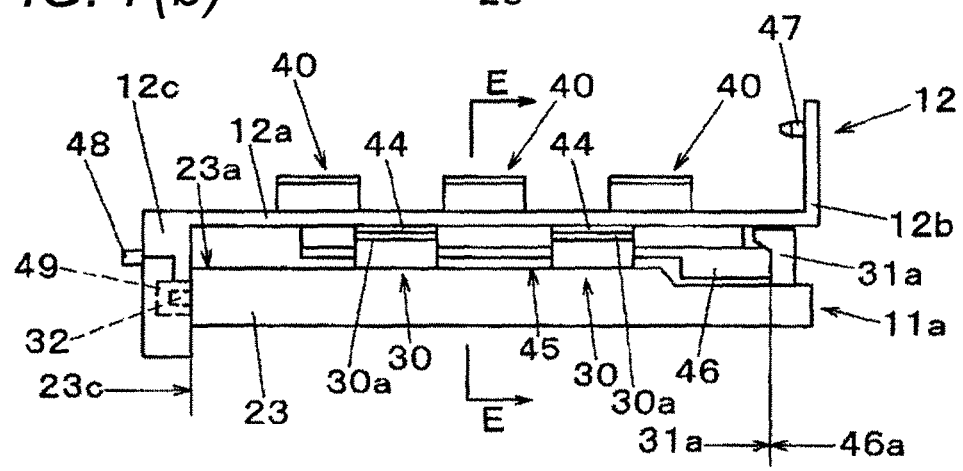
Figure 7C:
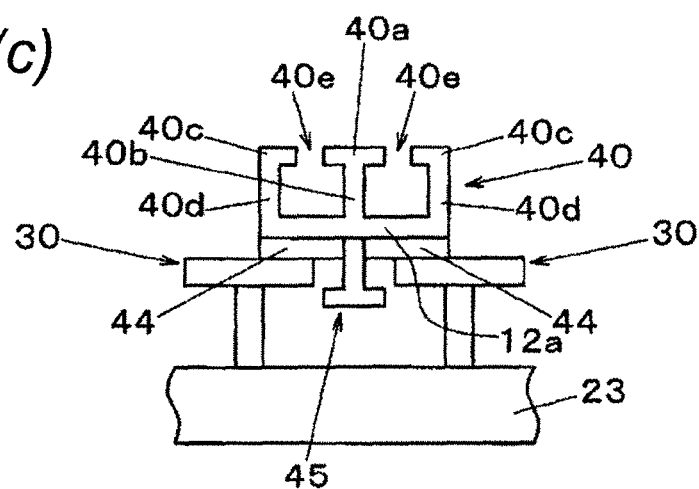
Figure 8A:
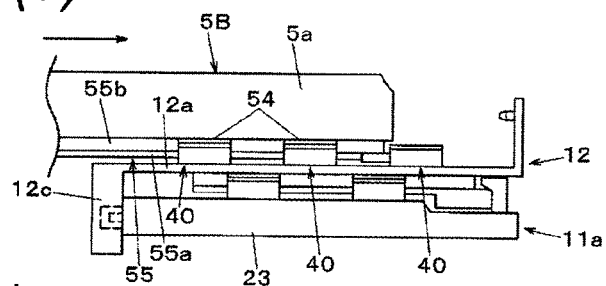
FIGS. 8(a), 8(b), 8(c) and 8(d) are drawings explaining installation states of a second tape feeder in an electronic component mounting apparatus according to an embodiment of the invention.
Figure 8B:
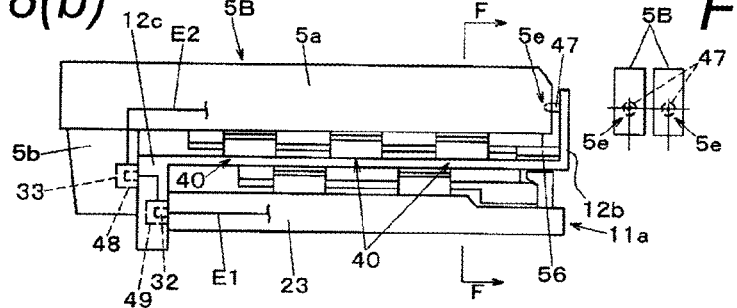
Figure 8C:
Figure 8D:
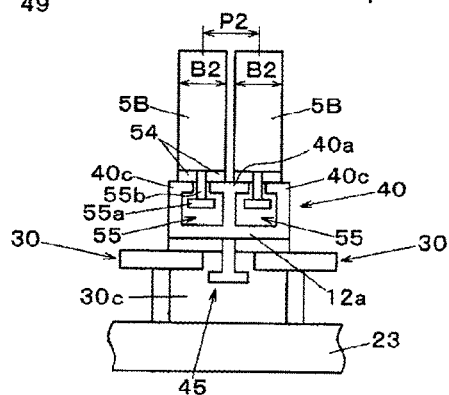

Next, when it becomes necessary to install the second tape feeder 5B on the feeder base 11a during the work process, perform the steps shown in FIGS. 7(a) to 7(c). In other words, the attachment 12 is mounted on the feeder base 11a. The attachment 12 includes a main body portion 12a where a longitudinal member 45 is provided on the lower surface with having an installing compatibility with a longitudinal member 35, and a second feeder installing slot 40e, being formed on the upper surface of the main body portion 12a, to be engaged with the longitudinal member 55 provided on the lower surface of the second tape feeder 5B, and having a standard width smaller than that of the first tape feeder 5A, out of two types of tape feeders 5. Thus, the array pitch of the second feeder installing slot 40a becomes the array pitch corresponding to the standard width of the second tape feeder 5B (an attachment mounting step).

Next, in a state that the attachment 12 is mounted on the feeder base 11a, as shown in FIGS. 8(a) to 8(d), fit the longitudinal member provided on the lower surface of the second tape feeder 5B into the second feeder installing slot 40e, and install the second tape feeder 5B on the feeder base 11a via the attachment 12 (a second feeder installing step).

As explained above, in the feeder installation attachment and the feeder installation method shown in the embodiment, the attachment 12 is mounted on the feeder base 11a in order to install the second tape feeder 5B having a standard width smaller than that of the first tape feeder 5A, and a second feeder installing slot 40e, which engages with the longitudinal member 55 (a second feeder side fitting part) provided on the lower surface of the second tape feeder 5B, is provided on the upper surface of the main body portion 12a. The attachment 12 is provided with a longitudinal member 45 (an attachment side fitting part) with having the installing compatibility with a longitudinal member 35 (a first feeder side fitting part), being provided on the lower surface of the first tape feeder 5A, which is directly installed on the feeder base 11a out of the plurality of types of tape feeders 5 with different standard widths. In a state that the attachment 12 is mounted on the feeder base 11a by fitting the longitudinal member 45 into the base side installing slot 30c, the array pitch of the second feeder installing slot 40e is smaller than the array pitch of the base side installing slot 30c, and becomes an array pitch corresponding to the standard width of the second tape feeder 5B. This make it possible to install a plurality of types of tape feeder 5 with different standard widths, and to achieve both effective use and compatibility of existing facilities for the purpose of improving versatility and area productivity of an electronic component mounting apparatus.

This application is based upon Japanese Patent Application No. 2012-121545, filed May 29, 2012, the entire contents of which are incorporated herein by reference.

INDUSTRIAL APPLICABILITY

A feeder installation attachment and a feeder installation method according to the invention have the effect of both effective use and compatibility of existing facilities for the purpose of improving versatility and area productivity of an electronic component installation apparatus, and are useful in the field of taking out an electronic component from a component supply unit provided with a tape feeder and mounting it on a substrate.

DESCRIPTION OF REFERENCE SIGNS

1: Electronic Component Mounting Apparatus
4: Component Supply Unit
5a: Main Body Portion
5A: First Tape Feeder
5B: Second Tape Feeder
11a: Feeder Base
12: Attachment
23: Base Plate
30: Installing Guide Member
30c: Base Side Installing Slot
32: Base Side Connector
33: Feeder Side Connector
35, 45, 55: Longitudinal Member
40: Twin Slot Installing Guide Member
40e: Second Feeder Installing Slot
E1: First Transmission Circuit
E2: Second Transmission Circuit
P1, P2: Array Pitch

The invention claimed is:
1. A feeder installation attachment used for installing a plurality of types of tape feeder with different standard widths on a common feeder base in an electronic component mounting apparatus, the feeder base having a plurality of rows of base side installing slots which engage with first feeder side fitting parts provided on a lower surface of a first tape feeder installed directly on the feeder base, out of the plurality of types of tape feeder,
said feeder installation attachment comprising:
a main body portion comprising attachment side fitting parts provided on a lower surface of the main body portion, the attachment side fitting parts having an installing compatibility with the first feeder side fitting parts; and
second feeder installing slots which are formed on an upper surface of the main body portion and which engage with second feeder side fitting parts provided on a lower surface of a second tape feeder having a standard width smaller than that of the first tape feeder, out of the plurality of types of tape feeder,
wherein in a state in which the attachment is mounted on the feeder base by fitting the attachment side fitting parts into the base side installing slots, an array pitch of the second feeder installing slots is smaller than an array pitch of the base side installing slots, and becomes an array pitch corresponding to the standard width of the second tape feeder.

2. The feeder installation attachment according to claim 1, wherein the main body portion is elongated in a front-rear direction assuming a front side to correspond to a feeder installing direction of the feeder base, and wherein the main body portion comprises a position setting part which is provided in a front end portion of the main body portion and which sets a front-rear position of the tape feeder and an in-plane position perpendicular to the front-rear direction, by locking a locked part provided in a front end portion of the tape feeder in a state in which the second feeder side fitting parts fit into the second feeder installing slots.

3. The feeder installation attachment according to claim 1, wherein the feeder base and the plurality of types of tape feeder are provided with a base side connector and a feeder side connector, respectively, which connect/disconnect a transmission circuit for transmitting at least an electric control signal, and wherein the feeder installation attachment further comprises a branch circuit which branches a first transmission circuit connected to the base side connector into a plurality of second transmission circuits connected to the feeder side connector.

4. A feeder installation method for installing a plurality of types of tape feeder with different standard widths on a common feeder base in an electronic component mounting apparatus, the feeder base having a plurality of rows of base side installing slots which engage with first feeder side fitting parts provided on a lower surface of a first tape feeder installed directly on the feeder base, out of the plurality of types of tape feeder, said feeder installation method comprising:

directly installing a first tape feeder on the feeder base by fitting the first feeder side fitting parts into base side installing slots;

mounting an attachment on the feeder base, the attachment comprising: a main body portion comprising attachment side fitting parts provided on a lower surface of the main body portion, the attachment side fitting parts having an installing compatibility with the first feeder side fitting parts; and second feeder installing slots which are formed on an upper surface of the main body portion and which engage with second feeder side fitting parts provided on a lower surface of a second tape feeder having a standard width smaller than that of the first tape feeder, out of the plurality of types of tape feeder, thereby making an array pitch of the second feeder installing slots correspond to the standard width of the second tape feeder; and installing the second tape feeder on the feeder base via the attachment by fitting the second feeder side fitting parts provided on the lower side of the second tape feeder into the second feeder installing slots in a state that the attachment is mounted on the feeder base.

* * * * *